United States Patent [19]

Nakano et al.

[11] 4,285,007
[45] Aug. 18, 1981

[54] COLOR SOLID-STATE IMAGER AND METHOD OF MAKING THE SAME

[75] Inventors: Toshio Nakano; Tadao Kaneko, both of Tokyo; Michiaki Hashimoto, Yono; Yoshio Hatano, Urawa; Haruo Matsumaru, Tokyo; Akira Sasano, Tokyo; Eiichi Maruyama, Kodaira, all of Japan

[73] Assignee: Hitachi, Ltd., Tokyo, Japan

[21] Appl. No.: 123,085

[22] Filed: Feb. 20, 1980

[30] Foreign Application Priority Data

Feb. 26, 1979 [JP] Japan .............................. 54-20801

[51] Int. Cl.³ .............................................. H04N 9/04
[52] U.S. Cl. ........................................ 358/44; 430/4
[58] Field of Search ................. 358/41, 43, 44, 55; 430/4

[56] References Cited

U.S. PATENT DOCUMENTS

| 4,190,446 | 2/1980 | Martin et al. | 430/25 |
| 4,196,010 | 4/1980 | Sandhu | 430/7 |
| 4,204,866 | 5/1980 | Horak et al. | 430/306 |

*Primary Examiner*—Robert L. Richardson
*Attorney, Agent, or Firm*—Craig and Antonelli

[57] ABSTRACT

A color solid-state imager comprises a semiconductor body over which are successively laminated a predetermined number of filter layers of any desired shape having predetermined spectral characteristics and, laminated on the filter layers, a predetermined number of layers composed of a transparent, organic high molecular material which is sensitive to radiation, the semiconductor substrate having at least a detector portion composed of an array of a plurality of optical detector elements. The method of making color solid-state imagers can be simplified by at least using the radiation-sensitive high molecular material for the intermediate layers or protection layers which are used for forming a laminate construction of color-decomposing filters.

Further, in mounting the color-decomposing filters on the semiconductor substrate, it is particularly preferred to form beforehand a film of an organic high molecular material.

8 Claims, 7 Drawing Figures

COLOR SOLID-STATE IMAGER AND METHOD OF MAKING THE SAME

BACKGROUND OF THE INVENTION

1. Field of the Invention

The present invention relates to a color solid-state imager and to a method of making the same.

2. Description of the Prior Art

The following method has heretofore been employed to make filters for decomposing the colors. Namely, a glass substrate is coated with a photosensitive liquid composed of a polyvinyl alcohol having photosensitive properties to form a photosensitive film. The photosensitive film is irradiated with light through a mask so that portions corresponding to a first color are optically hardened. The portions are then developed and are allowed to be left. A filter member composed of the photosensitive film is dyed with a dye having predetermined spectral characteristics. Then, a transparent intermediate layer is formed on the whole surfaces. The same procedure holds true for a filter member of a second color. Namely, the glass substrate is coated with the above-mentioned photosensitive liquid to form a photosensitive film, irradiated with light through a mask, and is developed to form a filter member of the second color. The filter member is dyed with a dye having predetermined spectral characteristics. Then, a transparent intermediate layer is formed on the whole surfaces. A filter member of a third color is then formed in the same manner, dyed with a dye, and is coated with a top film which serves as a protection film, thereby to obtain a complete color filter.

There has been proposed a color solid-stage imager constructed by placing a filter for decomposing color on a solid-state imager.

Such a color solid-state imager has generally been produced by separately making solid-state imagers and color-decomposing filters, and bringing the two elements into alignment to stick them together using an optical adhesive agent or the like. There has also been reported to use an optical matching oil in place of the optical adhesive agent.

It is not allowed to directly apply the above-mentioned method of making filters to a semiconductor substrate for solid-state imagers. It is because, the solid-state imagers have bonding pad portions which are not possessed by generally employed filters.

The following reference is cited to show the state of the Prior Art.

P. L. P. Dillon et al. International Electron Device Meeting 1976, Dec pp. 400–403.

Summary of the Invention

The present invention provides a color solid-state imager comprising a semiconductor body over which are successively laminated a predetermined number of filter layers of any desired shape having predetermined spectral characteristics and, laminated on the filter layers, a predetermined number of layers composed of a transparent, organic high molecular material which is sensitive to radiation, the semiconductor substrate having at least a detector portion composed of an array of a plurality of optical detector elements. The method of making color solid-state imagers can be simplified by at least using the radiation-sensitive high molecular material for the intermediate layers or protection layers which are used for forming a laminate construction of color-decomposing filters.

Further, in mounting the color-decomposing filter on the semiconductor substrate, it is particularly preferred to form beforehand a film of an organic high molecular material.

DETAILED DESCRIPTION OF THE PREFERRED EMBODIMENT

Figure 1:
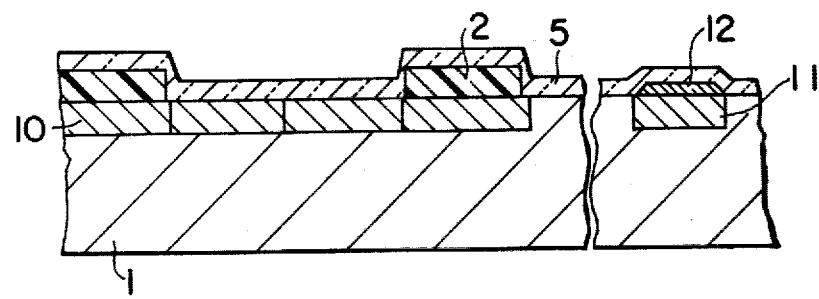
FIGS. 1 to 4 are cross-sectional views of an element for illustrating a method of making a color solid-state imager according to the present invention.

A first object of the present invention is to enhance the operation efficiency of the manufacturing method by placing color-decomposing filters directly on the optical detector portion of the solid-state imager.

A second object of the present invention is to form the color-decomposing filters maintaining sufficient precision and high quality.

A first technical feature of the present invention is to form the intermediate layers and protection layers which constitute color-decomposing filters by using a radiation-sensitive organic, high molecular material, so that the subsequent steps for making solid-state imagers can be advantageously carried out.

A second technical feature of the present invention resides in that the above-mentioned organic high molecular material should have a crosslinking property under heated conditions. This is desirable for reinforcing the intermediate layers which constitute a laminate construction of color-decomposing filters.

Third, the above-mentioned radiation-sensitive organic, high molecular material should be of a so-called positive working type from the standpoint of simplifying the manufacturing steps. The materials having negative working type radiation sensitivity can of course be employed. The material of the negative working type, however, must be irradiated with a predetermined light to establish the crosslinking reaction when the intermediate layers are being formed, resulting in the increase in the number of manufacturing steps.

Further, the filter members in many cases are provided with photosensitive properties. In this case, the photosensitive characteristics of the filter members should be different from the spectral characteristics of a material of intermediate layers and protection layers. The step of forming the filter members should not affect the underlying intermediate layers or protection layers.

Examples of the radiation-sensitive organic, high molecular material which can be effectively used for the present invention include the following:

(1) Poly(alkyl methacrylate) or a copolymer thereof:

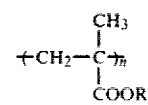

wherein R represents an alkyl group such as $CH_3$ or $C_4H_9$.

(2) Poly(glycidyl methacrylate) or a copolymer thereof:

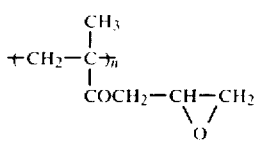

(3) Polymethacrylamide

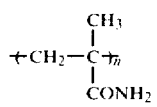

(4) Poly(Methyl isopropenyl ketone)

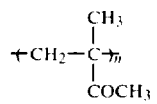

(5) Poly(butene-1-sulfone)

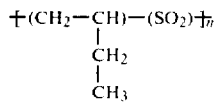

(6) Polyisobutylene

It is of course allowable to use radiation-sensitive organic, high molecular substances in addition to the above-mentioned examples.

In this specification, the radiation refers to ultraviolet rays, electron rays, X-rays, and the like.

A fourth feature of the present invention is that in mounting color-decomposing filters on a predetermined semiconductor substrate, surfaces of the semiconductor substrate are coated with a film of an organic, high molecular material. The film of the organic, high molecular material will be formed to a thickness of about 0.5 μm to 1 μm.

Surfaces of the semiconductor substrate are smoothed by the film of the organic, high molecular material. This presents the following advantages:

(1) Surfaces of the substrate are smoothed and enable the intermediate layers and layers of filter members to be easily formed.

It is further allowed to prevent colors from being mixed together during the step of dyeing, that will be caused by the deformation of intermediate layers.

(2) The substrate incorporates semiconductor devices. Therefore, the semiconductor devices are prevented from being contaminated during the step of forming color-decomposing filters. This is due to the fact that as the surfaces of the substrate are smoothed, areas on which impurities adhere are decreased.

(3) Further, the organic, high molecular material of a high purity works to prevent the semiconductor devices in the substrate from being contaminated by impurities.

To advantageously carry out the subsequent steps, the organic, high molecular material should be a radiation-sensitive organic, high molecular material which is used for forming the intermediate layers.

If the thickness of the film of the organic, high molecular material is too small, the aforementioned advantages will be reduced. Conversely, even if the thickness is too great, the advantages are not much exhibited but, rather, the transmission factor is decreased.

The invention is illustrated below in detail with reference to a concrete embodiment.

Figure 5:
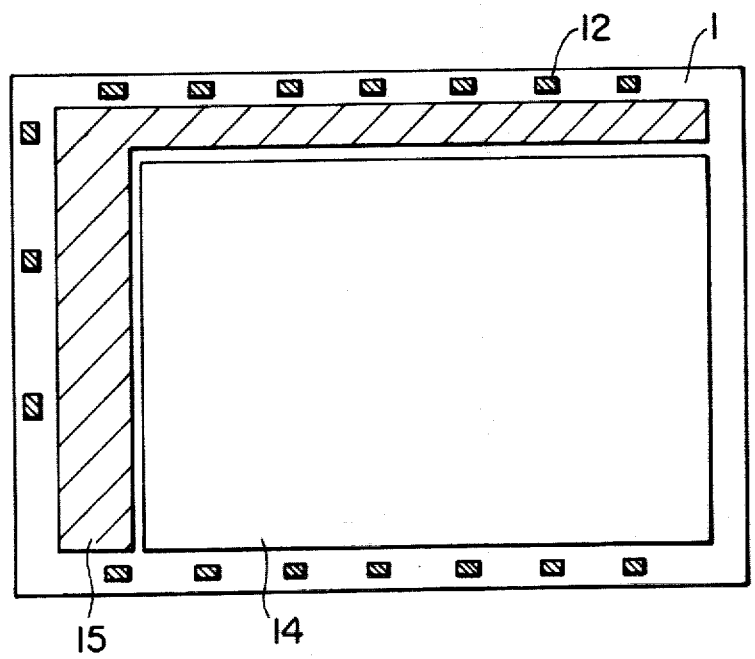
FIG. 5 is a plan view of the color solid-state imager.

FIGS. 1 to 4 are diagrams illustrating the steps for making a color solid-state imager of the present invention. Each diagram shows in cross section important portions of the element. FIG. 5 is a plan view of the imager. These diagrams do not show detailed construction in the semiconductor substrate.

In the color solid-state imager substrate 1 have been formed many optical detector portions 10 and a drive circuit 11 for driving them. The substrate 1 is usually made of silicon. The optical detector portions will be prepared using the same material as that of a semiconductor integrated circuit which forms a peripheral circuit for driving the detector portions, or using a different semiconductor material.

Figure 6:
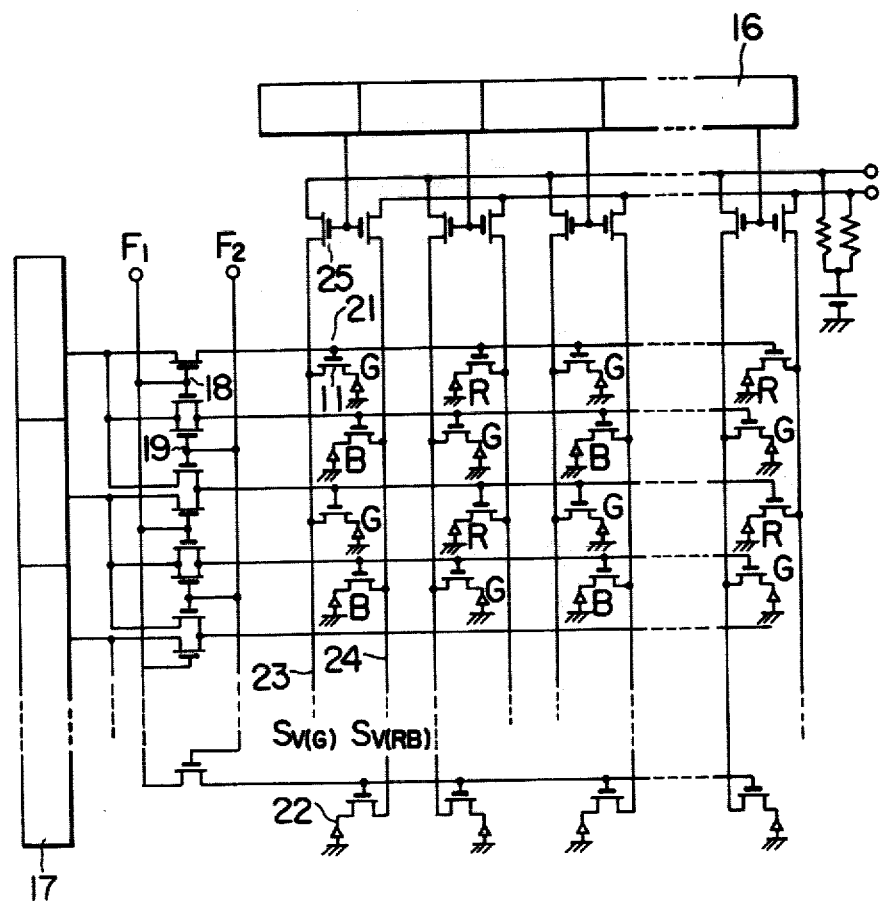
FIG. 6 is a diagram schematically illustrating the solid-state imager.

FIG. 6 is a diagram schematically illustrating a solid-state imager. In the center are arrayed photodiodes 22 which include vertical switches 21. In this embodiment, green elements G are arrayed checkerwisely, and between them are arrayed red elements R and blue elements B. These elements are connected to two vertical signal output lines 23, 24. In the periphery are formed scanning circuits for selecting horizontal switches 25 and vertical switches 21. A horizontally scanning circuit is formed on the upper side, and a vertically scanning circuit is formed on the left side.

The above-mentioned electronic circuits have been integrated in the semiconductor substrate 1 for solid-state imager. Color-decomposing filters must be provided for each of the photodiodes for green G, blue B and red R of FIG. 6. Steps for preparing color-decomposing filters are mentioned below with reference to FIGS. 1 to 4.

A layer for color-decomposing filter member is formed to a thickness of about 0.5 to 2.5 μm on the color solid-state imager substrate. The filter member is usually composed of gelatin, albumen, glue, casein, gum arabic and polyvinyl alcohol, which are provided with photosensitive properties. Generally, the photosensitive characteristics should be of the negative type and should be exhibited at 365 nm to 435 nm.

Only a portion 2 corresponding to a first color is irradiated with light through a mask to harden and develop it; only the portion 2 of the color-decomposing filter is left. The portion 2 is dyed with a dye having predetermined spectral characteristics using an aqueous solution of dye as is customarily performed.

Prior to forming the layer of the filter member of the first color, a film of an organic, high molecular material should desirably be formed on the surface of the substrate 1 to a thickness of about 0.5 to 1 μm. The film of the organic, high molecular material makes the surface of the substrate smooth. This presents advantages as mentioned earlier.

Figure 7:
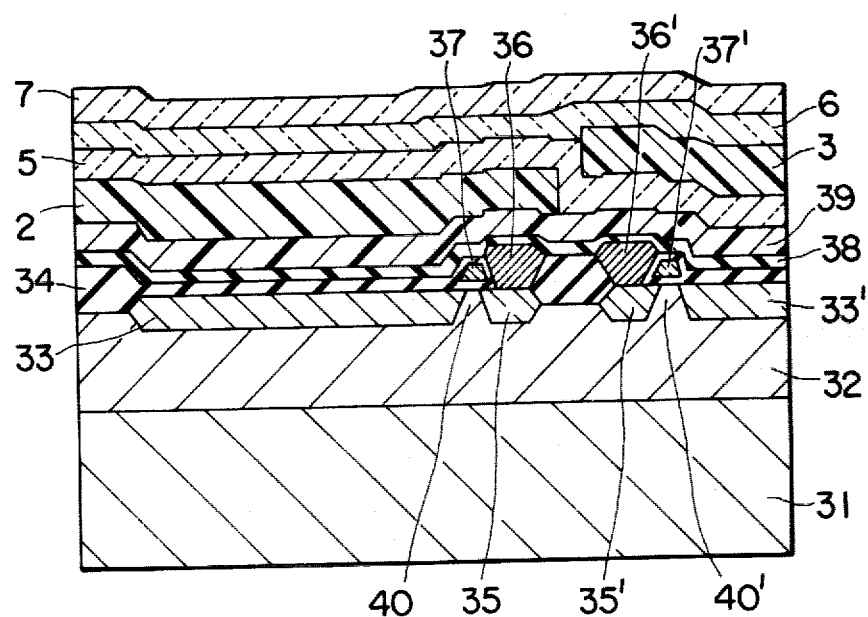
FIG. 7 is a cross-sectional view of a picture element.

FIG. 7 is a cross-sectional view of a picture element, illustrating in detail the construction in the semiconductor substrate. FIG. 7 illustrates in detail those which are not shown in FIGS. 1 to 4.

$N^+$-type diffusion layers 33, 33' for photodiodes have been integrated in a p-type well 32 which is formed on an n-type substrate 31. Reference numerals 35, 35' denote drains for producing signals, 36 and 36' denote vertical signal output lines, 37 and 37' denote gate electrodes, and 34 denotes an insulating film composed of $SiO_2$ or the like. Reference numerals 40 and 40' represent channels of a switch portion. A portion which exists between the $n^+$-type diffusion layer 33 for photodiode and the vertical signal output line 36 represents the optical detector portion 10 which is illustrated in FIG. 1. In general, an insulating film 38 for passivation composed of $SiO_2$ or the like has been formed on the semiconductor substrate. A color-decomposing filter is formed on the insulating film 38. Reference numeral 39 denotes a film of the above-mentioned organic, high molecular material which is useful for smoothing the surface of the substrate. The color-decomposing filter is constructed quite in the same manner as in FIG. 3. Namely, reference numerals 2, 3, 5, 6 and 7 in FIG. 7 represent the same members as those of FIG. 3.

Manufacturing steps are mentioned below in detail.

A semiconductor substrate is coated with a film of a transparent intermediate layer 5 to a thickness of 0.5 to 1.5 μm, the intermediate layer 5 having properties of not to be dyed with dyestuffs, as shown in FIG. 1. The intermediate layer 5 is composed of the aforementioned radiation-sensitive organic, high molecular material. It was already mentioned that the radiation-sensitive characteristics should be different from the photosensitive characteristics of the color-decomposing filter members.

Figure 2:
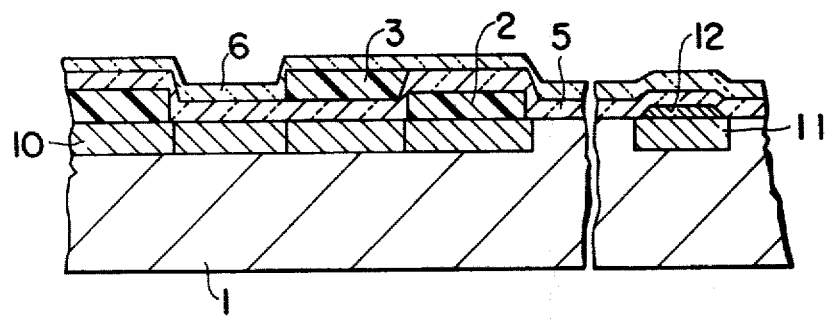

With reference to FIG. 2, then, another layer of color filter member is formed, irradiated with light through a mask, developed to form a filter portion 3 of a second color, and is dyed with a dye having predetermined spectral characteristics. Then, a transparent intermediate layer 6 is formed.

Figure 3:
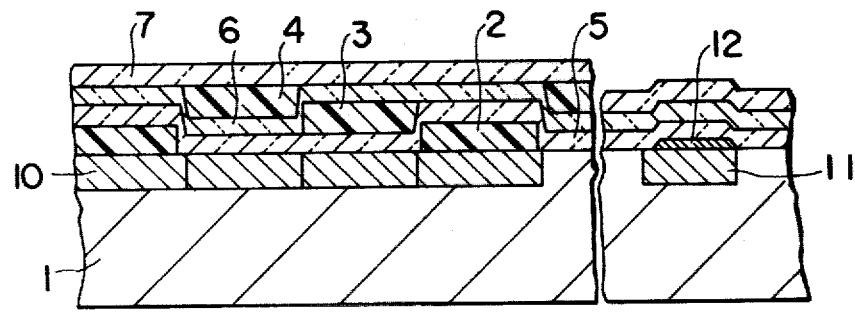
Figure 4:
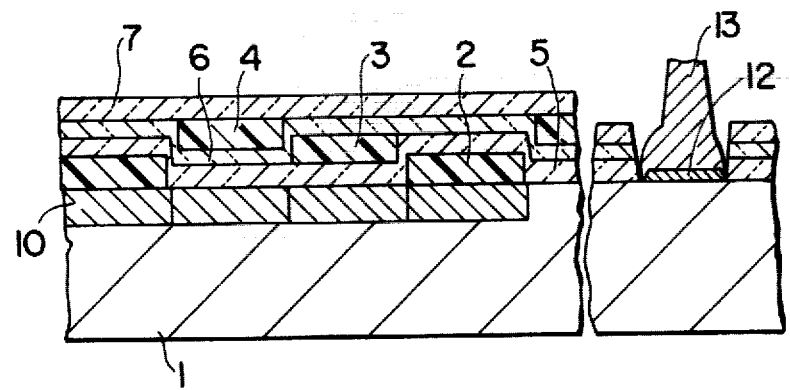

Referring to FIG. 3, a color filter 4 is formed in the same manner as above, dyed, and then a protection film 7 is formed.

Both the intermediate layer 6 and the protection film 7 are composed of the radiation-sensitive organic, high molecular material like the intermediate layer 5.

Color-decomposing filters of three colors are thus formed through the above-mentioned steps.

In dyeing the color-decomposing filters, the blending of dyes, contents, temperature of dyeing liquid and dyeing time should be determined in accordance with the conventional dyeing method.

Table 1 shows concrete examples of the filter members, intermediate layers and protection layers.

TABLE 1

| Concrete example | Filter member | | | Intermediate layer and protection layer | | |
|---|---|---|---|---|---|---|
| | Material | Photosensitive characteristics | Exposure time | Material | Photosensitive characteristics | Exposure time |
| 1 | Gelatin | *250–440 nm | 10 sec. | Poly(glycidyl methacrylate) | Electron ray- 250 nm | 6 min. |
| 2 | Gelatin | *250–440 nm | 10 sec. | Poly(methyl methacrylate) | Electron ray- 250 nm | 2 min. |
| 3 | Gelatin | *250–440 nm | 10 sec. | Poly(methyl isopropenyl ketone) | Electron ray 230–320 nm | 20 sec. |
| 4 | Polyvinyl alcohol | *250–440 nm | 10 sec. | Poly(glycidyl methacrylate) | Electron ray- 250 nm | 6 min. |
| 5 | Glue | 250–440 nm | 10 sec. | Poly(methyl methyacrylamide) | Electoron ray | 10 min. |
| 6 | Gelatin | *250–440 nm | 10 sec. | Poly(hexa- fluorobutyl methacrylate) | X-ray | 10 min. |
| 7 | Gelatin | *250–440 nm | 10 sec. | Poly(butene-1 sulfone) | Electron ray X-ray | $80J/cm^2 \times 10$ min. |

*Filter members exhibit strong photosensitivity at a main light-emitting peak of 365 nm from an ultra-high pressure mercury lamp; wavelengths smaller than 300 nm are usually absorbed by a masking glass.

Examples of the dyeing conditions are illustrated below.

(1) Blending of dyes:
  Green:
    Sirius Yellow GC         0.8% by weight
    Lissamine Green V        0.4% by weight
    Acetic acid              2% by weight
    Water
  Blue:
    Methyl Blue              1% by weight
    Acetic acid              2% by weight
    Water
  Red:
    Ponceau S                0.3% by weight
    Kayanol Yellow N5G       0.08% by weight
    Acetic acid              2% by weight
    Water
(2) Dyeing temperature, time:
    Green: 40° C., 2 min.
    Blue: 40° C., 1 min.
    Red: 40° C., 2 min.

Among the above-mentioned radiation-sensitive materials, crosslinking property upon heating is exhibited by a poly(glycidyl methacrylate), poly(methyl methacrylamide), poly(methyl methacrylate-co-methacryloyl chloride) pertains to copolymer of poly(methyl methacrylate), and such like.

After the intermediate layer has been formed, the above-mentioned material is heated to a temperature that triggers the crosslinking reaction. The intermediate layer exhibits increased resistance against water and increased property of not being dyed with dyes.

The heating should be effected at about 200° C. and for about 15 minutes, so that the molecular weight of the intermediate layer is considerably increased by the crosslinking reaction to exhibit increased resistance against water.

A mask is applied except predetermined portions such as bonding pad portions 12 on the color solid-state imager substrate 1, and an ultraviolet ray is irradiated. The exposure conditions are as shown in Table 1. A Xe-Hg lamp (1 kW) will be suitably used as a light source for far ultraviolet rays. Then, the three laminated layers for forming filters are developed to remove predetermined portions. Thus, the predetermined portions such as bonding pad portions are punched. FIG. 5 is a plan view of the color solid-state imager. A light detector portion 14, a circuit 15 for driving the light detector portion, and bonding portions 12 are arrayed on a silicon chip substrate. The filter members on the bonding portions are removed by the above-mentioned method, so that bonding pads are exposed. Then, gold or an alloy of aluminum and silicon (silicon content 0.5 to 1% by weight) is bonded onto the bonding pads by ultrasonic waves. Or an alloy of gold and tin (gold content 10% by weight) is thermally adhered onto the bonding pads of gold.

Thus, the color solid-state imager is completed.

By forming the intermediate layer and the protection layer using the radiation-sensitive organic, high molecular material as mentioned above, it is allowed to directly form the filter layers contributing to the reduction in the number of manufacturing steps.

Although the foregoing embodiment has dealt with the case in which the scanning circuit was composed of MOS-type field effect transistors, it should be understood that the present invention is in no way restricted thereto. For instance, a CCD (charge coupled device) may be employed as the scanning circuit.

There has also been proposed a solid-state imager in which an imager surface is formed with a photoconductive layer. According to this solid-state imager, the semiconductor substrate in which switching elements and scanning circuit are formed, has been covered. An example is found, for example, in Japanese patent Laid-Open No. 51-10715. The present invention can be of course applied to such solid-state imagers.

What is claimed is:

1. A color solid-state imager in which color-decomposing filters are formed, via layers of an organic, high molecular material, over a semiconductor body having at least a light detector portion in which are arrayed a plurality of light detector elements.

2. A color solid-state imager according to claim 1, wherein said organic, high molecular material is composed of a radiation-sensitive material.

3. A color solid-state imager according to claim 1 or 2, wherein said color-decomposing filters comprise filter layers having predetermined shapes and predetermined spectral characteristics, and layers of a transparent radiation-sensitive organic, high molecular material, which are successively laminated in required numbers.

4. A method of making color solid-state imagers comprising: a step for forming a color-decomposing filter layer having a predetermined shape and predetermined spectral characteristics over a semiconductor body which has at least a light detector portion in which a plurality of light detector elements are arrayed; a step for forming a layer of a transparent radiation-sensitive organic high molecular material; a step for forming a color-decomposing filter layer having a predetermined shape and predetermined spectral characteristics; and a step for forming a layer of a transparent radiation-sensitive organic high molecular material; the above-mentioned steps being repetitively carried out to successively form filter layers of desired shapes which have been dyed, and the uppermost layer being made of a transparent radiation-sensitive organic high molecular material, said method of making color solid-state imagers further comprising: a step for irradiating predetermined portions of said laminated filter layers with a predetermined radiant ray; and a step for processing said laminated filter layers.

5. A method of making color solid-state imagers according to claim 4, wherein said radiation-sensitive organic high molecular material is a positive-working photosensitive material.

6. A method for making color solid-state imagers according to claim 4 or 5, wherein said radiation-sensitive organic high molecular material is a thermosetting material, and the layer of said radiation-sensitive organic high molecular material is formed by applying a solution of said material followed by heating.

7. A method of making color solid-state imagers according to claim 4, 5 or 6, wherein said filter members is a negative-working radiation-sensitive organic high molecular material, and said transparent radiation-sensitive organic high molecular material formed on the layer of said filter member has positive-working photosensitive characteristics.

8. A method of making color solid-state imagers according to claim 4, 5, 6 or 7, wherein in forming a layer of the filter member on said semiconductor substrate, a layer of a radiation-sensitive organic high molecular material is formed beforehand on said semiconductor substrate, and a layer of the filter member is formed thereon.

* * * * *